United States Patent
Nishiyama

(10) Patent No.: US 8,376,238 B2
(45) Date of Patent: Feb. 19, 2013

(54) SEMICONDUCTOR STORAGE DEVICE

(75) Inventor: Taku Nishiyama, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 147 days.

(21) Appl. No.: 12/887,000

(22) Filed: Sep. 21, 2010

(65) Prior Publication Data

US 2011/0101110 A1    May 5, 2011

(30) Foreign Application Priority Data

Oct. 30, 2009   (JP) .................................. 2009-251283

(51) Int. Cl.
  *G06K 19/06*    (2006.01)
(52) U.S. Cl. ........................................ 235/492; 235/487
(58) Field of Classification Search .................. 235/487, 235/492
  See application file for complete search history.

(56) References Cited

U.S. PATENT DOCUMENTS

| | | | |
|---|---|---|---|
| 6,538,331 B2 * | 3/2003 | Masuda et al. | 257/777 |
| 6,621,155 B1 * | 9/2003 | Perino et al. | 257/686 |
| 6,686,663 B2 * | 2/2004 | Masuda et al. | 257/777 |
| 7,061,105 B2 * | 6/2006 | Masuda et al. | 257/723 |
| 2006/0261489 A1 * | 11/2006 | Takemoto et al. | 257/774 |
| 2007/0170573 A1 * | 7/2007 | Kuroda et al. | 257/686 |
| 2007/0228509 A1 * | 10/2007 | Okada et al. | 257/503 |
| 2009/0166829 A1 | 7/2009 | Nishiyama et al. | |
| 2010/0172112 A1 | 7/2010 | Okada | |

FOREIGN PATENT DOCUMENTS

JP    2009-158739    7/2009

* cited by examiner

Primary Examiner — Daniel Hess
Assistant Examiner — Paultep Savusdiphol
(74) Attorney, Agent, or Firm — Oblon, Spivak, McClelland, Maier & Neustadt, L.L.P.

(57) ABSTRACT

According to one embodiment, a semiconductor device includes a memory chip and a controller chip. A circuit board includes a first surface on which an array of external connection terminals are provided and an second surface on which the memory and controller chips are provided. An array of connection pads is provided on the second surface and outside the memory chip at an external connection terminal side. An array of resistor devices is provided on the second surface and along the array of connection pads at the opposite side of the memory chip. Plugs outside near-memory-chip ends of the external connection terminals penetrate the first and surfaces. A first wiring passes outside the array of resistor devices and the array of connection pads on the second surface, and connects one resistor device and one plug. A second wiring on the first surface connects one plug and one external connection terminal.

19 Claims, 13 Drawing Sheets

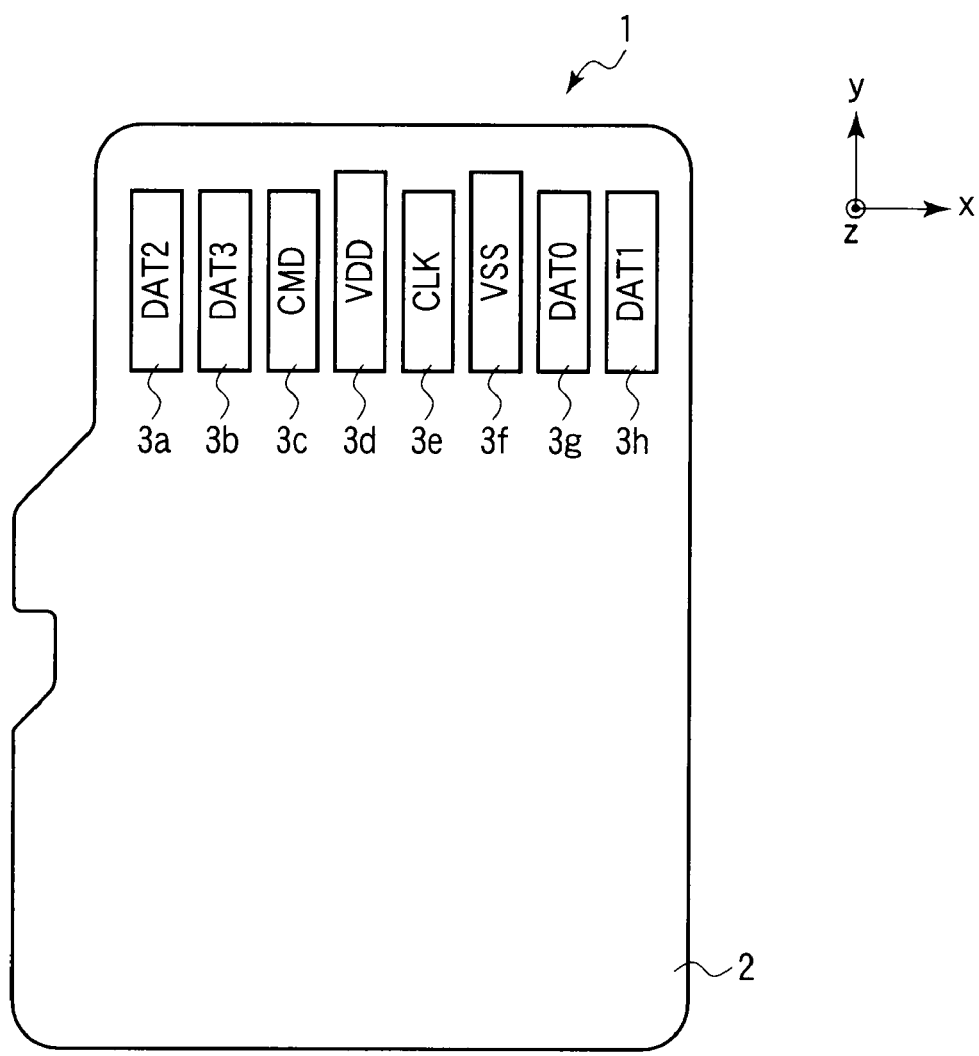
F I G. 1

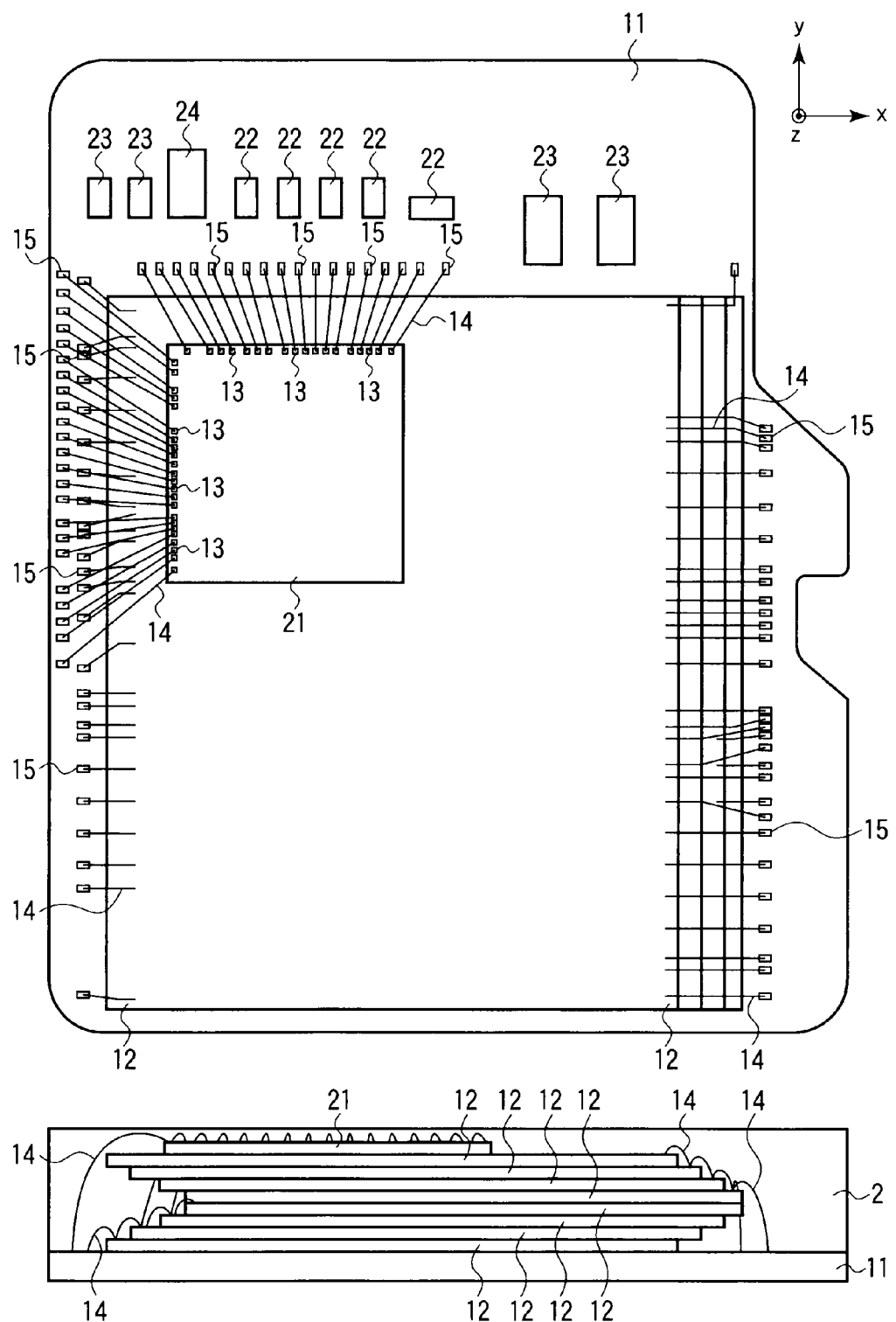
F I G. 3

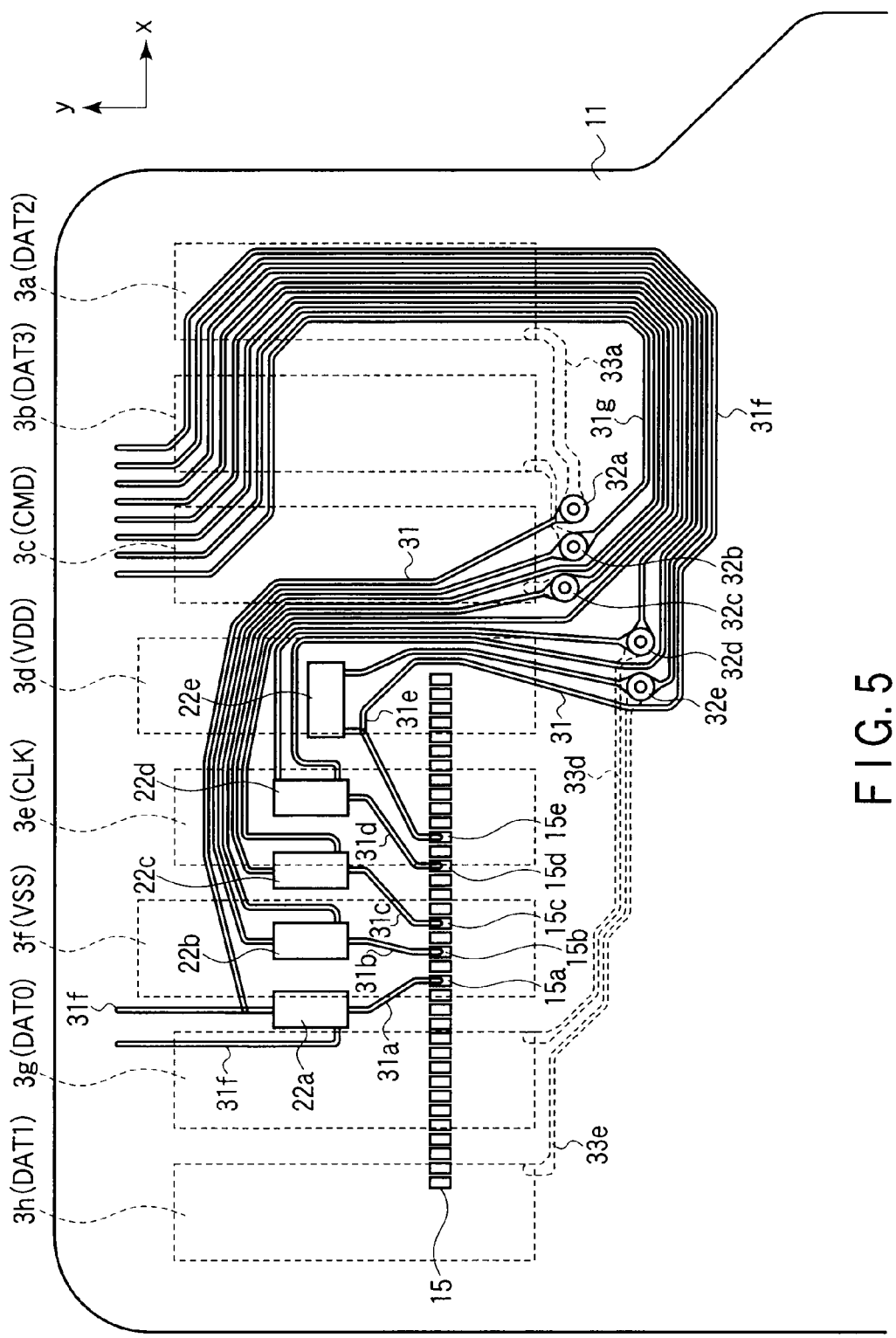
F I G. 5

| Signal name | Between controller pad and resistor device | Between controller pad and card terminal |
|---|---|---|
| DATA0 | 1.14 | 9.26 |
| DATA1 | 1.48 | 8.68 |
| DATA2 | 0.82 | 9.24 |
| DATA3 | 0.76 | 7.62 |
| CMD | 0.94 | 6.06 |

Unit [mm]

| Signal name | Between controller pad and resistor device | Between controller pad and card terminal |
|---|---|---|
| DATA0 | 1.14 | 5.22 |
| DATA1 | 1.48 | 6.91 |
| DATA2 | 0.82 | 7.75 |
| DATA3 | 0.76 | 6.27 |
| CMD | 0.94 | 5.27 |

Unit [mm]

SEMICONDUCTOR STORAGE DEVICE

CROSS-REFERENCE TO RELATED APPLICATIONS

This application is based upon and claims the benefit of priority from Japanese Patent Application No. 2009-251283, filed Oct. 30, 2009; the entire contents of which are incorporated herein by reference.

FIELD

Embodiments described herein relate generally to a semiconductor storage device, and to a configuration of a memory card comprising a semiconductor memory chip and a controller chip for controlling the memory chip, for example.

BACKGROUND

There is widely used a memory card for storing therein videos, images and music data. The memory card is often used to store data for a host apparatus such as cell phone, personal digital assistance, portable music player and digital camera. It is important for the memory card to have a large storage capacity and additionally to be small in order to be efficiently used in the portable small-sized host apparatus. Further, it is important to improve data transfer speed between the memory card and the host apparatus.

The memory card includes a semiconductor memory chip and a controller chip for controlling a semiconductor memory. A NAND flash memory is used as the semiconductor memory, for example.

SD™ card (to be referred to as SD card below) is known as the memory card. Micro SD™ card (to be referred to as micro SD card below) is present. The micro SD card and the SD card has almost the same operation and performance. However, the micro SD card is smaller in size than the SD card. Like the SD card, various constraints to be complied by products are defined in a specification for the micro SD card. In order to be applicable to all the kinds of products, the micro SD card can be preferably assured in product's reliability and can be efficiently designed and manufactured.

BRIEF DESCRIPTION OF THE DRAWINGS

FIG. 1 illustrates an example of an outer shape of a memory card according to a first embodiment;

FIG. 3 illustrates an internal configuration of the memory card according to the first embodiment;

FIG. 5 illustrates part of a component side of a circuit board according to the first embodiment;

DETAILED DESCRIPTION

Figure 2:
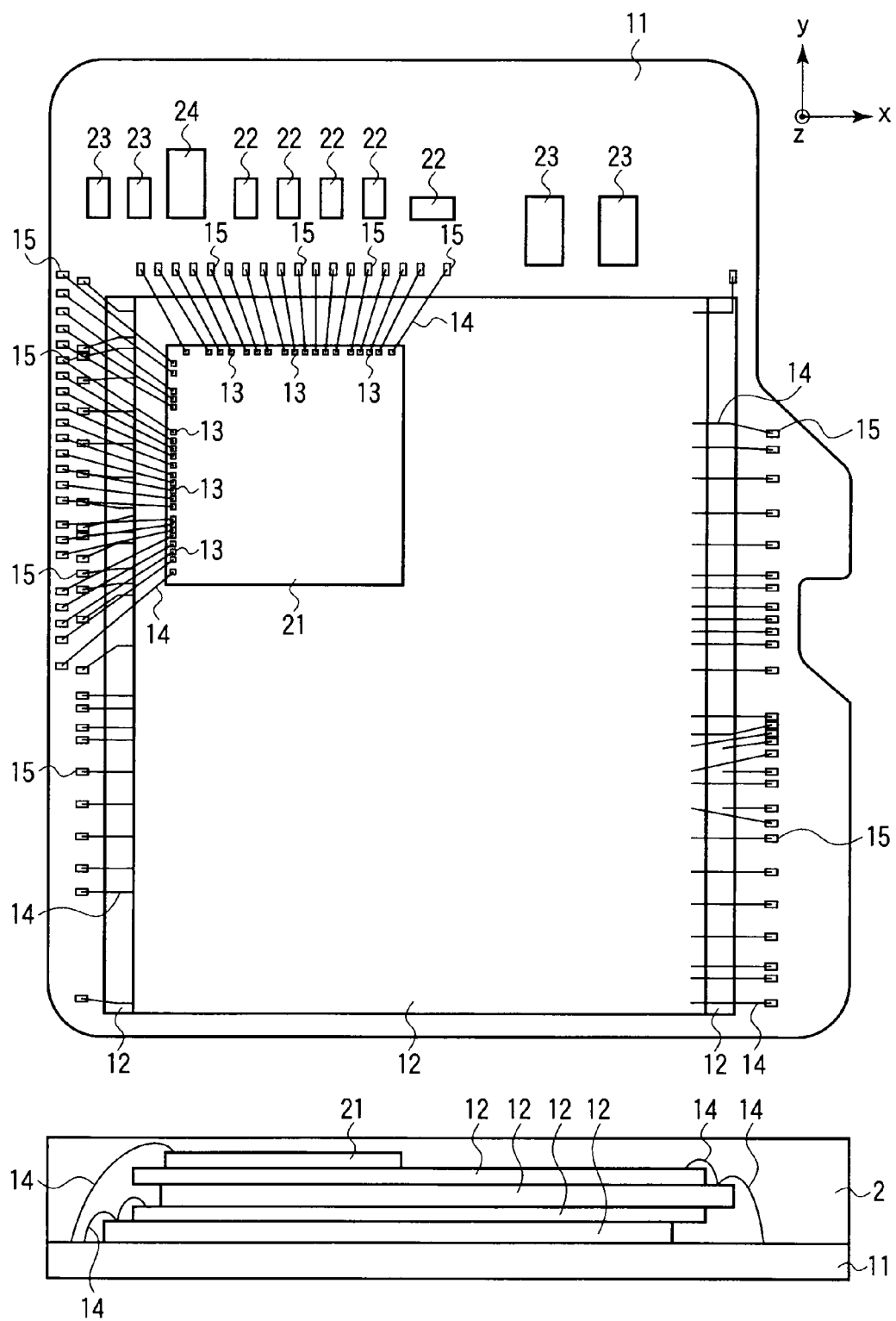
FIG. 2 illustrates an internal configuration of the memory card according to the first embodiment.

In general, according to one embodiment, a semiconductor storage device is disclosed. The device includes a memory chip that includes a memory circuit. The device includes a controller chip that includes a control circuit to control the memory circuit. The device includes a circuit board that includes opposite first and second surfaces and an array of external connection terminals on the first surface, the memory chip and the controller chip being provided on the second surface. The device includes an array of connection pads provided on the second surface of the circuit board and outside the memory chip at an external connection terminal side, and connected to the controller chip. The device includes an array of resistor devices provided on the second surface and provided along the array of connection pads at the opposite side of the memory chip, the resistors being connected at respective one ends to the connection pads. The device includes conductive plugs provided outside near-memory-chip ends of the external connection terminals, and penetrating the first surface and the second surface. The device includes a first wiring provided on the second surface, connected at one end to the other end of one resistor device, passing outside the array of resistor devices and outside the array of connection pads, and connected at the other end to one plug at the second surface. The device includes a second wiring provided on the first surface, and connecting one plug and one external connection terminal.

Embodiments according to the present invention will be described below with reference to the drawings. In the following description, like reference numerals denote components having substantially the same function and configuration, and repeated description will be made as needed. An alphabet following a number constituting a reference numeral is referred to by the reference numeral containing the same number and is used for distinguishing the components having the same configuration. When the components indicated by the reference numerals containing the same number do not need to be distinguished from each other, the components are referred to by the reference numeral containing only a number. For example, when the components denoted with reference numerals 1a and 1b do not need to be distinguished from each other, the components are collectively referred to by reference numeral 1.

Note that the drawings are schematic and a relationship between a thickness and a plan dimension or a ratio of thickness of each layer are different from what they really are. Thus, specific thicknesses or dimensions are to be decided in consideration of the following description. A relationship or ratio in dimension between components is different between the drawings.

In the following embodiments, a memory card will be described by way of a micro SD card. However, the memory card in the following description is not limited to the micro SD card. Instead, the description of the specification is applied to all the memory cards on which constraints and objects imposed on the micro SD card and objects described later are imposed.

The micro SD card and the SD card have almost the same characteristics except for the size. For example, the two types of cards each includes a memory chip and a controller chip for controlling the memory chip. On the other hand, since the SD card is larger in size than the micro SD card, the design constraints imposed on the SD card is looser than that on the micro SD card. In other words, the micro SD card is more difficult to design than the SD card.

As described above, the micro SD card is more difficult to design than the SD card, and at the same time, has the same configuration as the SD card except for the size. Thus, memory card's manufacturers typically first develop the SD card and then develop the micro SD card. For the development of the micro SD card, it is easily expected to attempt to use a memory chip and a controller chip used for the SD card. However, as described above, the micro SD card cannot be manufactured to have exactly the same configuration and a similar shape as the SD card due to the size constraint. Thus, the micro SD card is assumed to partially have a different configuration from the SD card.

The embodiments according to the present invention based on the above background will be described.

(First Embodiment)

FIG. 1 schematically shows a specific example of an outer shape of a memory card 1. The configuration is used also for the first embodiment. FIG. 1 shows a terminal side. A memory card's capacity and others are displayed on the opposite surface to the terminal side. As shown in FIG. 1, the memory card 1 includes mold resin 2. The mold resin 2 seals a chip described later and a component side (opposite to the terminal side) of a circuit board. The terminal side arranges thereon a plurality of (eight of which are illustrated) external connection terminals 3a to 3h along the upper end of the memory card 1. The external connection terminals 3 are made of a conductive material, are formed on the circuit board, are connected to conductive wirings printed on the circuit board, and electrically connect a host apparatus and the memory card 1 when the memory card 1 is inserted in the host apparatus. The external connection terminals 3 form part of respective specific signal paths. In the example conforming to a standard of the micro SD card for assigning signals to the external connection terminals 3, the external connection terminals 3a to 3h are assigned data 2 (DAT2), data 3 (DAT3), command (CMD), VDD, clock (CLK), VSS, data 0 (DAT0) and data 1 (DAT1), respectively. The external connection terminals 3a to 3h have substantially the same length along the x-axis. The external connection terminals 3a, 3b, 3c, 3e, 3g and 3h have substantially the same length along the y-axis. The external connection terminals 3d and 3f have substantially the same length along the y-axis and are longer than the lengths of the external connection terminals 3a, 3b, 3c, 3e, 3g and 3h along the y-axis. The lower ends of the external connection terminals 3a to 3h along the x-axis are substantially aligned.

FIG. 2 schematically shows an internal configuration of the memory card 1 from the component side. The component side is opposite to the terminal side. As shown in FIG. 2, the memory card 1 includes a circuit board 11. The circuit board 11 includes the component side and the terminal side. The terminal side includes the external connection terminals 3 and the conductive lines thereon. The component side includes devices such as resistors, capacitors and fuses, and a chip thereon. The component side is sealed by the mold resin. The terminal side comprises the mold resin thereon except for the external connection terminals 3. The external connection terminals 3 are exposed at the terminal side by opening.

A large difference in configuration between the SD card and the micro SD card is on which of the component side and the terminal side of the circuit board the controller chip is to be mounted. The SD card may have the controller chip arranged on the terminal side of the circuit board. On the other hand, the micro SD card has the controller chip arranged on the component side of the circuit board. The micro SD card is differently configured from the SD card. As described above, the SD card has the controller chip arranged on the terminal side of the circuit board. Thus, electric connection between the controller chip pads and the memory card terminals can be made through bonding wires between the controller chip pads and connection pads on the circuit board and lines between the connection pads and the terminals. On the other hand, the micro SD card has the terminals and the controller chip arranged on different surfaces of the circuit board. Thus, the terminals and the controller chip are electrically connected by conductive plugs penetrating through the circuit board.

The memory card has a rule on line characteristics. Each line path between the pad of the controller chip and the external connection terminal of the memory card is preferably as short as possible. For the micro SD card, such a constraint on the line length applies to paths of data signals (data 0 to data 3) and the command signal. Damping resistors may be inserted in the signal paths between the controller chip pads and the external connection terminals. The constraint on the lengths of the signal paths between the controller chip pads and the external connection terminals and the insertion of the damping resistors in the signal paths are directed for restricting unwanted rising of the signals (i.e., for alleviating noises) passing through the signal paths. Then, it is preferable that line length between the controller chip pad and the damping resistor is 4 mm or less.

Returning to FIG. 2, the configuration of the memory card 1 will be further described. As shown in FIG. 2, one or more memory chips 12 are provided on the component side of the circuit board 11 at the bottom in the y-axis. When two or more memory chips 12 are provided, the memory chips 12 are stacked on top of each other using, for example, an adhesive (not shown) along the z-axis. The memory chips 12 may employ any type of memory chip, and more specifically any type of NAND flash memory chip, for example. The first embodiment is not limited by the specific examples of the memory chip. Four memory chips 12 are illustrated in FIG. 2, but other number of memory chips 12 may be used. For example, as shown in FIG. 3, eight memory chips 12 may be stacked on top of each other. Pads (not shown) of each memory chip are connected to connection pads 15 on the circuit board 11 via conductive bonding wires 14. The connection pads 15 are connected to conductive lines (not shown) on the circuit board 11.

A controller chip 21 is arranged on the top memory chip 12. The controller chip 21 is directed for controlling the operations of the memory chip 12, writes or read data in or from the memory chip 12, erases data from the memory chip 12 according to commands from the outside of the memory card 1, and manages the data storage state by the memory chip 12. The management of the storage state refers to management of which physical address page (or physical block) stores data of a specific logical address assigned by the host and which physical address page (or physical block) is in an erased state (i.e., stores no data or invalid-data).

The controller chip 21 includes a host interface, an micro processing unit (MPU), a read only memory (ROM), a random access memory (RAM) and a memory interface.

The host interface includes hardware and software interfacing the host and a circuit inside the controller chip. The memory card 1 communicates with the host via the host interface, defines protocol for enabling the communication between the memory card 1 and the host, and includes a set of various commands. The MPU controls the operations of the entire memory card 1, and reads firmware (control program) stored on the ROM onto the RAM to perform a specific processing when the memory card 1 is supplied with power. The MPU creates various tables on the RAM, or receives a write command, a read command or an erase command from the host to perform a specific processing on the memory chip 12 according to the control program. The ROM stores thereon control programs and others to be controlled by the MPU. The RAM temporarily stores thereon the control programs or various tables. The tables include a conversion table (logical table) of physical addresses of pages which actually store the data having a logical address assigned to the data by a file system. The memory interface performs an interface processing between the circuits inside the controller chip and the memory chip 12.

Figure 4:
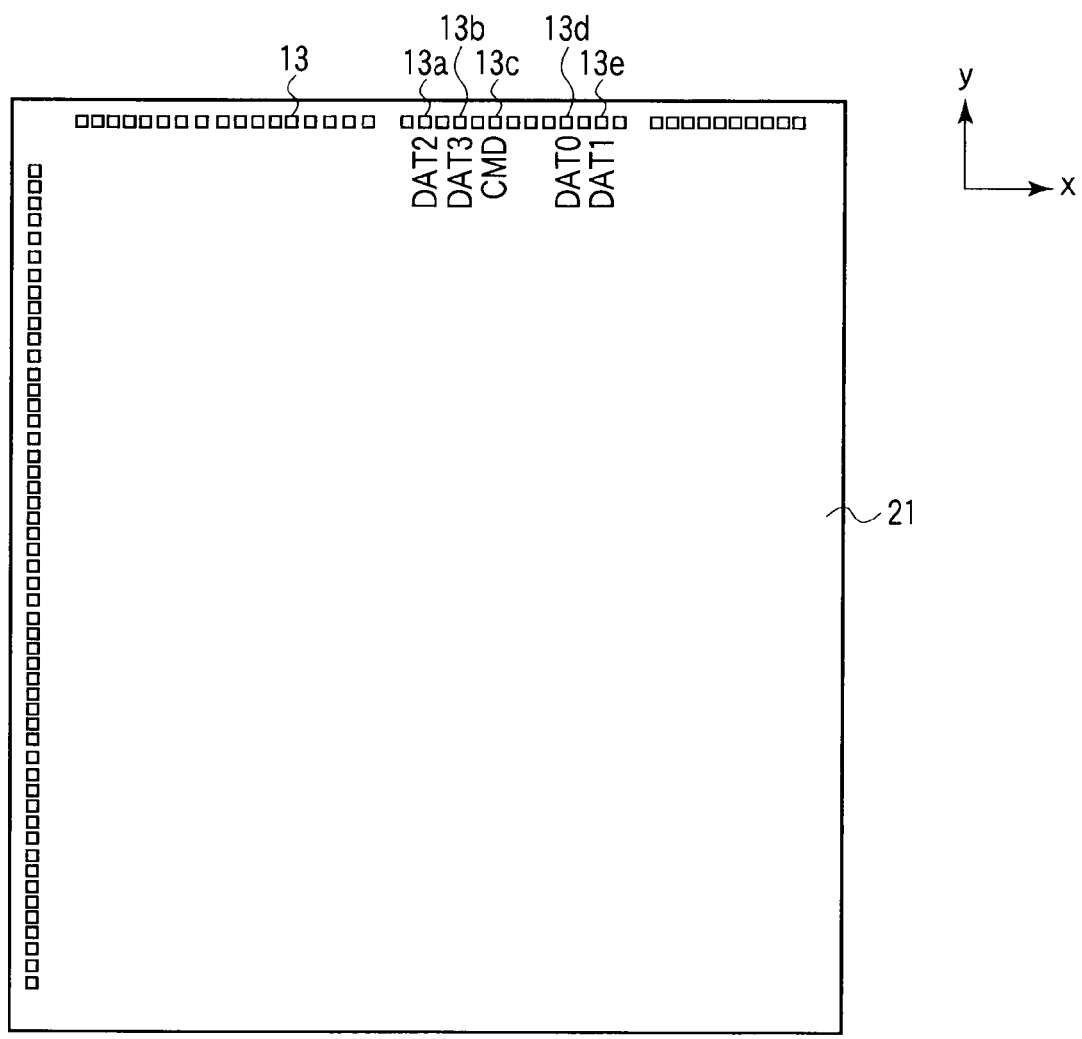
FIG. 4 illustrates a controller chip usable for the first embodiment.

The controller chip 21 may be of any type capable of being used in the memory card so long as it has the characteristics described above. The controller chip 21 may employ the one shown in FIG. 4, for example. As shown in FIG. 4, the controller chip 21 includes external connection pads 13 on its top side. The external connection pads 13 are electrically connected to the circuits inside the controller chip 21. The external connection pads 13 are arranged along only the upper end and the left end of the controller chip 21 and near those ends, for example. Some of the external connection pads 13 arranged along the upper end are the external connection pads 13 through which a "0" data 0 to "3" data and the command pass. More specifically, the 12th, 14th, 18th, 20th and 22th external connection pads 13a to 13e from the rightmost external connection pad 13 among the external connection pads 13 along the upper end are assigned the "1" data the "0" data, command, the "3" data and the "2" data, respectively. The controller chip 21 may be the same as that used in the SD card.

The controller chip 21 is arranged at the upper left of the xy plane, for example, near the upper left corner of the memory chip 12. The controller chip 21 has the external connection pads 13, arranged in L-shape as shown in FIG. 4, arranged along the left end and the upper end of the controller chip 21.

Resistor devices 22, capacitors 23 and fuses 24 are arranged above the memory chips 12 in the y-axis on the component side of the circuit board 11. The resistor devices 22 are the damping resistors described above.

Figure 6:
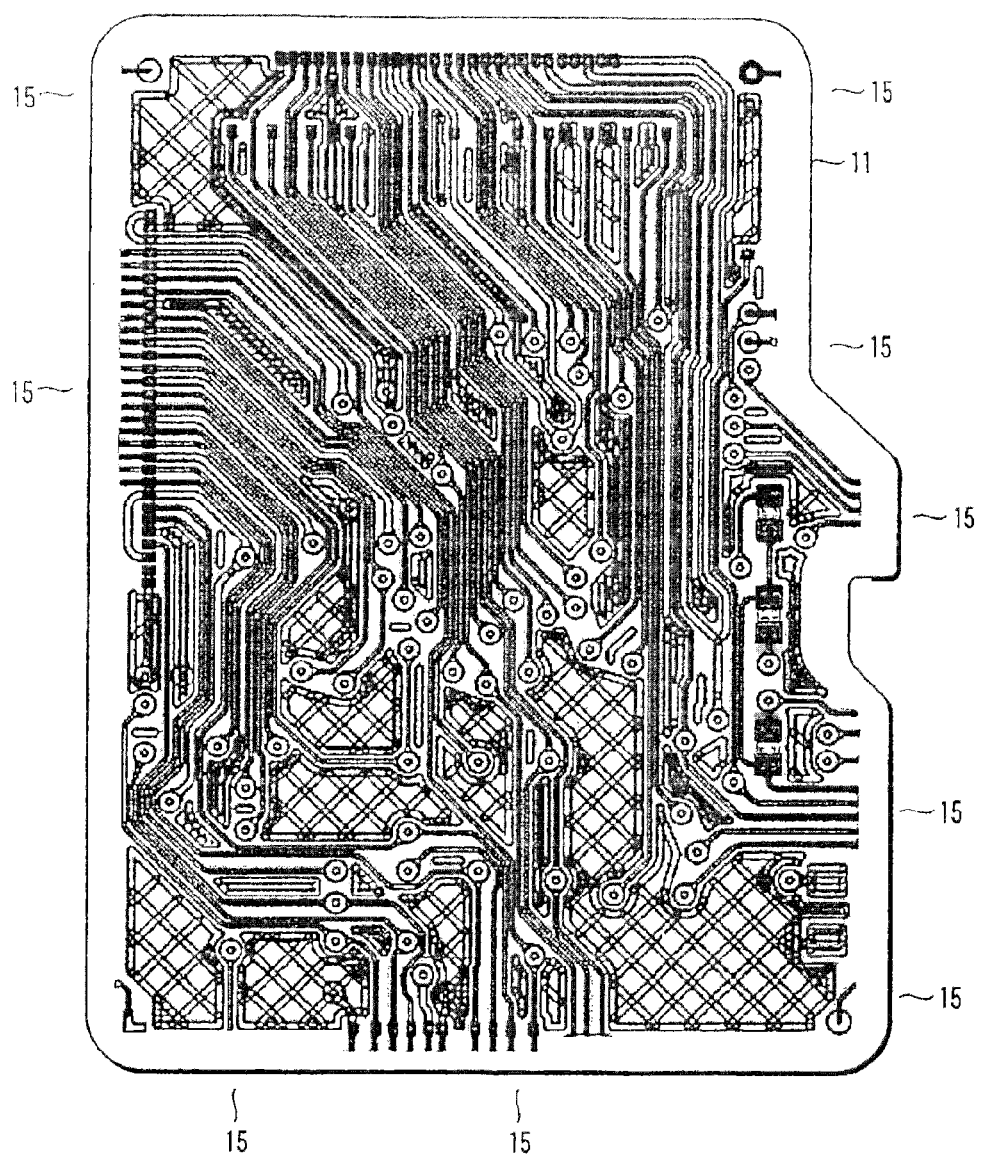
FIG. 6 illustrates part of a terminal side of the circuit board according to the first embodiment.

FIGS. 5 and 6 schematically illustrate part of the component side of magnified circuit board 11. FIG. 5 illustrates a configuration near the external connection terminals 3 on the component side of the circuit board 11 and illustrates also the configuration of the terminal side in dashed lines. FIG. 6 illustrates the configuration of the terminal side for the same part of the circuit board 11 of FIG. 5. FIGS. 5 and 6 illustrate some of the elements provided in the circuit board 11 for data signals (data 0 to data 3) and command signal. Other elements are omitted.

As shown in FIG. 5, connection pads 15 are arranged along the x-axis. An array of connection pads 15 is arranged near the external connection pads 13 of the controller chip 21 and along an array of the external connection pads 13. As described above, the controller chip 21 is arranged near the upper left corner of the top memory chip 12 when viewed from the component side. Thus, the array of the connection pads 15 is positioned above the upper end of the controller chip 21 in the y-axis. More specifically, the array of the connection pads 15 is positioned along the y-axis slightly below the center of the external connection terminals 3a to 3h in the y-axis. Further, the array of the connection pads 15 is positioned along the x-axis slightly leftward from the center of the array of the external connection terminals 3a to 3h in the x-axis.

As detailed later, the connection pads 15 are electrically connected to the external connection terminals 3 via conductive lines 31, the resistor devices 22, conductive plugs 32 and lines 33, respectively.

For the application with the controller chip 21 provided on the component side of the circuit board 11 like the memory card 1, the wirings 31 on the component side and the wirings 33 on the terminal side are interconnected via the plugs penetrating through the circuit board 11. Since the connection pads 15 are on the back of the external connection terminals 3, directly connecting the plugs to the external connection terminals 3 can reduce path lengths between the connection pads 15 and the external connection terminals 3. However, the plugs directly connected to the external connection terminals 3 will experience a mechanical pressure through repeated insertion/removal to/from the host apparatus of the memory card 1. Such pressure deteriorates the plugs themselves and a connection between the plugs and the external connection terminals 3. Thus, providing plugs on the external connection terminals 3 is not undesirable in terms of reliability of the memory card 1. On the other hand, it is preferable that the wiring lengths between the connection pads 15 and the external connection terminals 3 be as short as possible. Thus, the plugs 32 are provided immediately below the lower ends of the external connection terminals 3 as near to the external connection terminals 3 as possible.

The plugs 32 are provided substantially at the center of the array of the external connection terminals 3 in the x-axis direction, more specifically, slightly rightward from the center of the array. While the plugs 32 are arranged away from the connection pads 15, the distances of the wirings 31 and 33 are decided depending on the positions of the plugs 32, the lengths of the wirings 31a to 31e preferably have the same value, and the lengths of the wirings 33a to 33e preferably have the same value. As shown in FIG. 5, more specifically, the plugs 32a to 32e are at substantially the same positions in the y-axis coordinate, and the x-axis coordinate of the leftmost plug 32e is provided at substantially the same position as the x-axis coordinate of the rightmost connection pad 15x.

The resistor devices 22 are inserted between the plugs 32 and the connection pads 15 which are arranged as above. Of course, the wiring 31 through the plug 32, the connection pad 15 and the resistor device 22 is preferably as short as possible. The resistor devices 22 are arranged at the positions decided in consideration of this point and the positions of the connection pads 15 and the plugs 32. More specifically, the resistor devices 22a to 22e are provided between the connection pads 15 and the top side of the circuit board 11 in the y-axis and are provided slightly above the connection pads 15. The resistor devices 22a to 22e are provided near the center of the array of the external connection terminals 3 in the x-axis, more specifically, slightly leftward from the center of the array. By way of example, the longer sides of the resistor devices 22a to 22d are along the y-axis and the longer side of the resistor device 22e is along the x-axis. The orientations of the resistor devices 22a to 22e are not limited to the example.

The 15th, 17th, 19th, 23rd and 25th connection pads 15a to 15e from the left among the connection pads 15 are contained in the signal paths into which the resistor devices are to be inserted. More specifically, for example, the connection pads 15a to 15e are connected to the external connection pads 13a to 13e in FIG. 4, respectively. In other words, the connection pads 15a to 15e are for data DATA2, data DATA3, command CMD, data DATA0 and data DATA1, respectively.

The connection pads 15a to 15e are connected to the ends of the resistor devices 22a to 22e via the wirings 31a to 31e, respectively. The wirings 31a to 31e spread upwardly in fan-like manner with the connection pads 15 as the starting point. The wirings 31a to 31d are connected to the lower ends of the resistor devices 22a to 22d. The wiring 31e is connected to the left end of the resistor device 22e.

The other ends of the resistor devices 22a to 22e are connected to the plugs 32a to 32e via the wirings 31, respectively. The wirings 31 connected to the other ends of the resistor devices 22a to 22d pass by the right end of the array of the resistor devices 22 and the right end of the array of the connection pads 15. More specifically, the wirings 31 connected to the other ends of the resistor devices 22a to 22d extend substantially along the x-axis over the resistor devices 22a to 22e, bend along the y-axis outside the right end of the array of the plugs 32 and reach the corresponding plugs 32a to 32e.

Figures 7, 8:
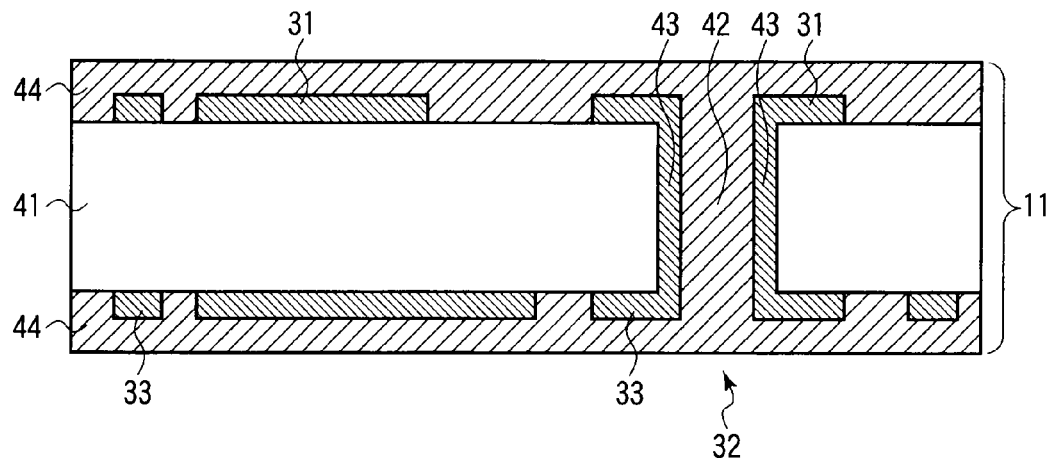
FIG. 7 is a sectional view of the circuit board according to the first embodiment.
FIG. 8 illustrates lengths of signal paths according to the first embodiment.

As shown in FIG. 7, the plugs 32 electrically connect the wirings 31 on the component side of the circuit board 11 and the wirings 33 on the terminal side. FIG. 7 is a sectional view of the circuit board 11. As shown in FIG. 7, the circuit board 11 includes a base member 41. The base member 41 is a copper laminated plate, for example. The base member 41 has two opposite main surfaces. The two main surfaces correspond to the component side and the terminal side of the circuit board 11. The two main surfaces of the base member 41 have the wirings 31 and 33 arranged thereon, respectively. The wirings 31 and 33 are made of copper foil and copper plating, for example, and have the aforementioned plane shape. The base member 41 includes through-holes 42 penetrating through the two main surfaces. The side face of the through-hole 42 is provided with a conductive material 43 and the wirings 31 and 33 are connected by the conductive material 43. The conductive material 43 is made of the same material as the wirings 31 and 33, for example. The plug 32 is formed by the through-hole 42 and the conductive material 43. The two main surfaces of the base member 41 and the wirings 31 and 33 are covered with solder resist 44. The solder resist 44 is embedded in the through-hole 42 via the conductive material 43.

Referring again to FIGS. 5 and 6, the wirings 33a to 33e are connected to the external connection terminals 3a, 3b, 3c, 3g and 3h, respectively. The array of the plugs 32a to 32e is positioned below the array of the external connection terminals 3a to 3e in the y-axis direction at the center of the array of the external connection terminals 3a to 3h, more specifically, substantially below the external connection terminals 3d and 3c. Accordingly, the wiring 33c extends substantially along the y-axis. The wirings 33a and 33b extend toward the external connection terminals 3a and 3b along the x-axis, and are connected to the external connection terminals 3a and 3b, respectively, below the same. The wirings 33d and 33e extend toward the external connection terminals 3g and 3h substantially along the x-axis, then extend upward along the y-axis, and reach below the external connection terminals 3g and 3h. The wirings 33d and 33e are connected to the external connection terminals 3g and 3h, respectively.

Each of the resistor devices 22a to 22e is connected to the wiring 31f on the component side of the circuit board 11. The wiring 31 is used in order to plate the plugs 32 and wirings 31. The wiring 31f connected to the resistor device 22a extends along the y-axis and reaches slightly above the upper end of the external connection terminal 3d along the y-axis. The wirings 31f connected to the resistor devices 22b to 22e extend in parallel to the wirings 31, leading to the position of the line of the plugs 32a to 32e. The wiring 31f extends along the y-axis immediately at the back of the external connection terminal 3a along the lower end and the right end of the external connection terminal 3b after passing through the plugs 32a to 32e, extends along the upper ends of the external connection terminals 3b and 3c, and reaches slightly above the upper end of the external connection terminal 3d in the y-axis direction. The plugs 32a to 32e are connected to the wirings 31g on the component side of the circuit board 11. The wirings 31g extend along the wirings 31f and reach the same positions.

The connection pads 15, the wirings 31, the resistor devices 22 and the plugs 32 are formed and arranged as described above. Thus, in case the memory card 1 is a micro SD card, the wiring path lengths shown in FIG. 8 can be attained. In other words, the signal path lengths between the external connection pads 13 in the controller chip 21 and the resistor devices 22 are 1.14 mm, 1.48 mm, 0.82 mm, 0.76 mm and 0.94 mm for data DATA0, DATA1, DATA2, DATA3 and command CMD, respectively. Every value is less than 1.5 mm. The signal path lengths between the external connection pads 13 in the controller chip 21 and the external connection terminals 3 are 9.26 mm, 8.68 mm, 9.24 mm, 7.62 mm and 6.06 mm for data DATA0, DATA1, DATA2, DATA3 and command CMD, respectively. Every value is less than 10 mm.

Figure 15:
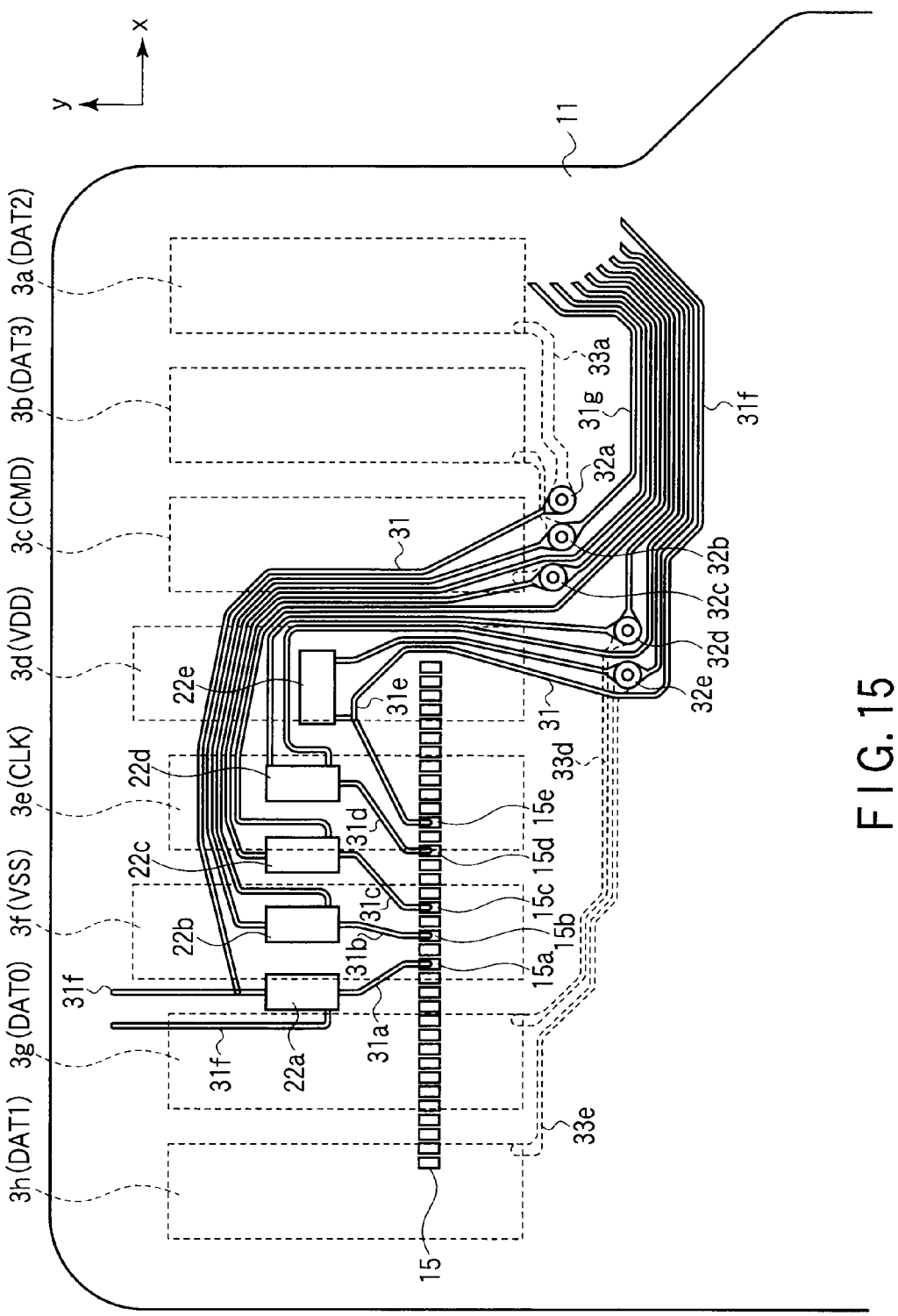
FIG. 15 illustrates another example of the configuration around the external connection terminals on the component side of the circuit board.

The configuration of the component side of the circuit board 11 may be different from FIG. 5 and may be configured as shown in FIG. 15. FIG. 15 shows another example of the configuration around the external connection terminals 3 on the component side of the circuit board 11, and shows the configuration of the terminal side in dashed lines. As shown in FIG. 15, the wiring 31f extends along the lower end of the external connection terminal 3b after passing through the plugs 32a to 32e, and reaches below the external connection terminal 3a in the y-axis direction. The wiring 31g extends along the wiring 31f and reaches the same position as the end of the wiring 31f. It is not needed that the wiring 31f extends right end of the external connection terminal 3b and the upper end of the external connection terminal 3d in FIG. 5. The wirings 31f and 31g are formed as shown in FIG. 15 so that the wirings 31f and 31g are short and consequently a capacity between the wirings can be reduced. Other points than the above points of the configuration shown in FIG. 15 are the same as those of FIG. 5.

As described above, the memory card according to the first embodiment includes the array of the connection pads 15 along the array of the external connection pads 13, the plugs 32 having the x-axis coordinate near the right end of the connection pads 15 and having the y-axis coordinate immediately below the lower ends of the external connection terminals 3, and the resistor devices 22 positioned above the array of the connection pads 15 in the xy plane. The arrangement can realize all of the followings: to arrange the controller chip 21 on the component side of the circuit board 11; to insert the resistor devices in the signal paths between the external connection pads 13 and the external connection terminals 3; and to restrict the signal path lengths between the external connection pads 13 and the external connection terminals 3 and the signal path lengths between the external connection pads 13 and the resistor devices 22, thereby meeting the rule for both the signal path lengths. In other words, the plugs do not overlap with the external connection terminals 3 while meeting the constraint of the signal path length so that the controller chip 21 can be arranged on the component side of the circuit board 11. Since the plugs 32 do not overlap with the external connection terminals 3, reliability can remain high for the mechanical configuration at the boundaries between the plugs 32 and the external connection terminals 3 and therearound. Since the controller chip 21 can be arranged on the component side, the controller chip 21 designed to be suitable for being arranged on the terminal side of the circuit board can be arranged on the component side of the circuit board 11, thereby promoting the manufacture of the memory card 1 through the controller chip 21.

(Second Embodiment)

The circuit board 11 includes the two opposite main surfaces (two layers) in the first embodiment. The circuit board includes four layers in a second embodiment.

Figure 9:
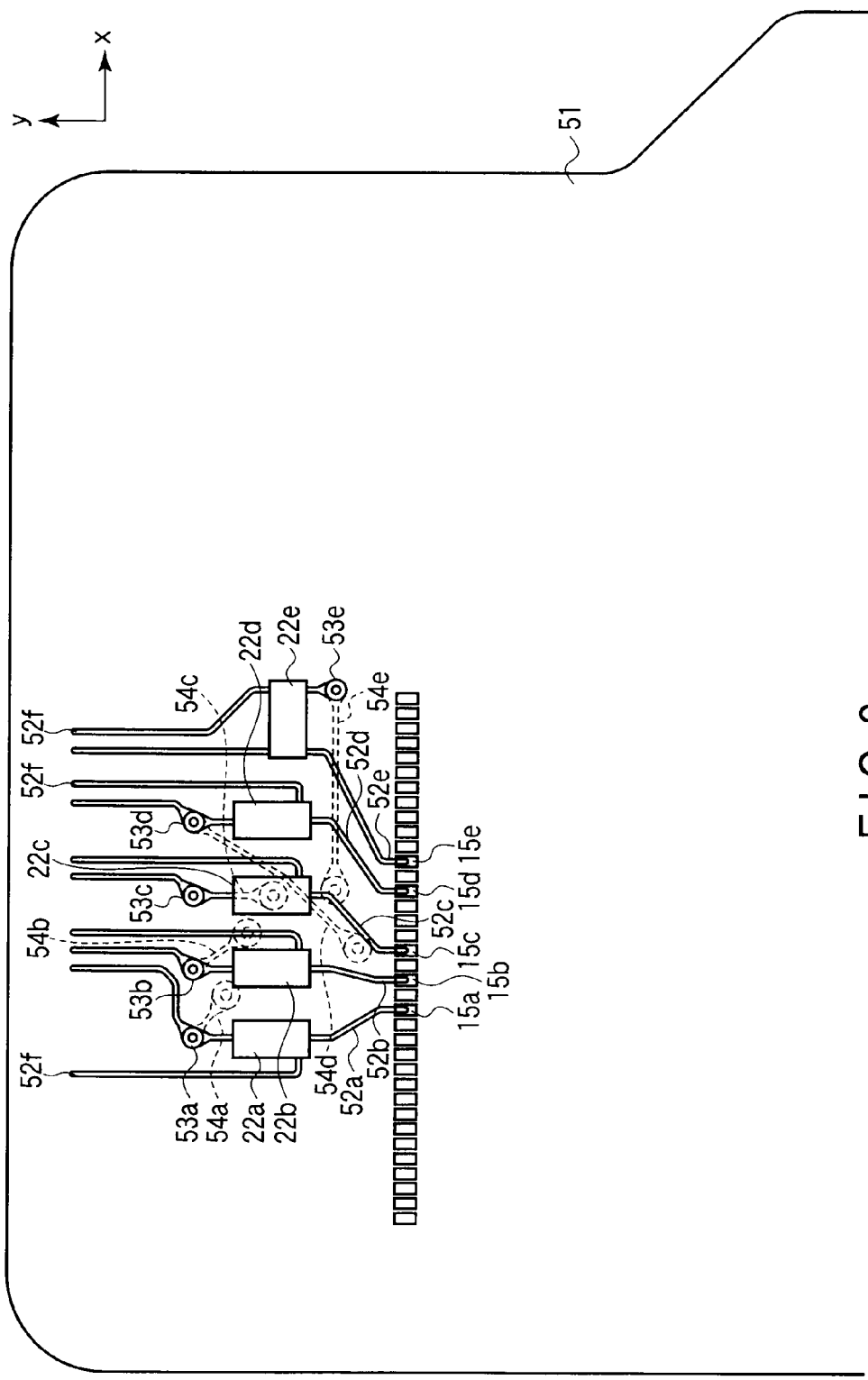
FIG. 9 illustrates one layer of a circuit board according to a second embodiment.
Figure 10:
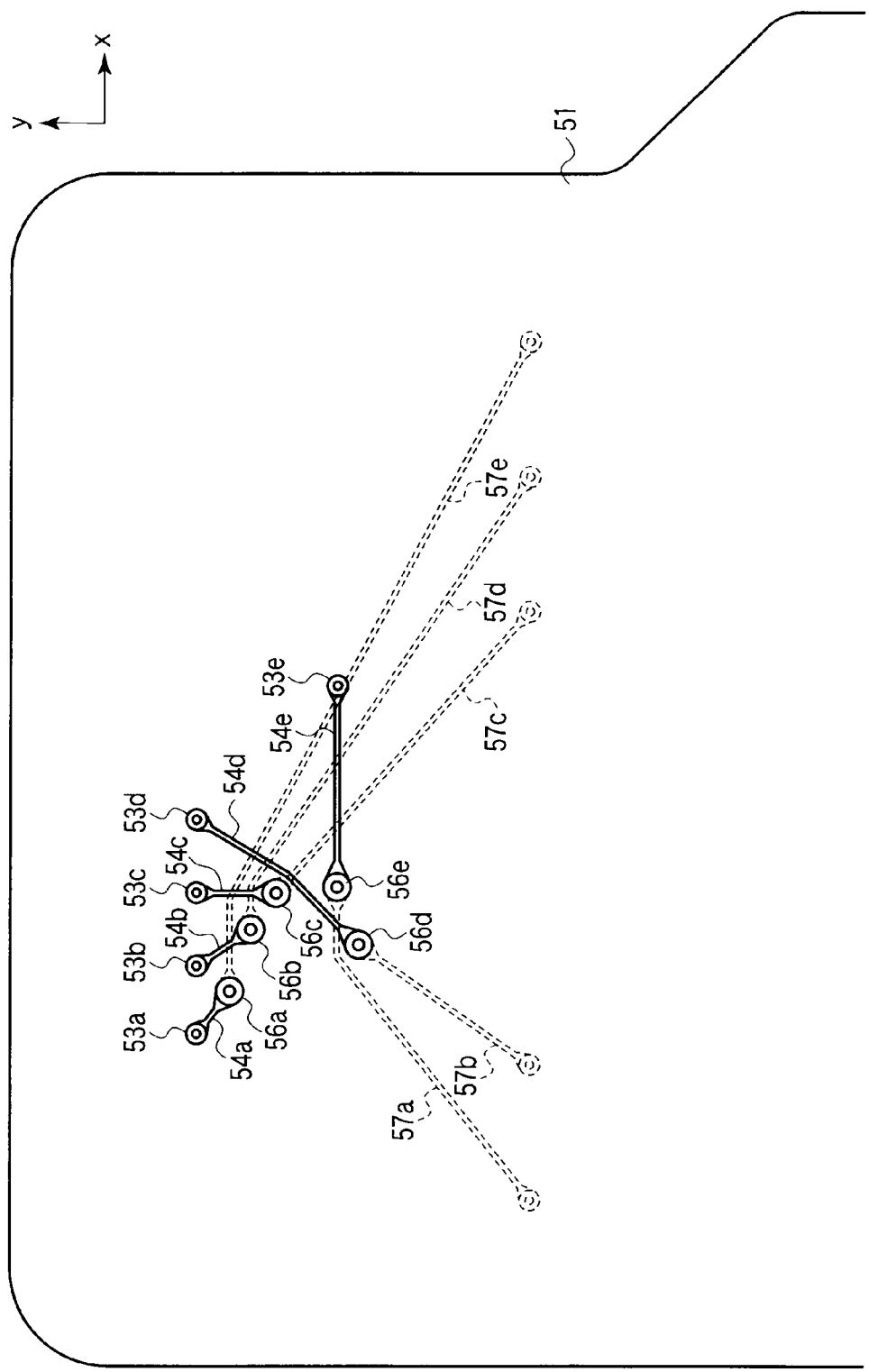
FIG. 10 illustrates one layer of the circuit board according to the second embodiment.
Figure 11:
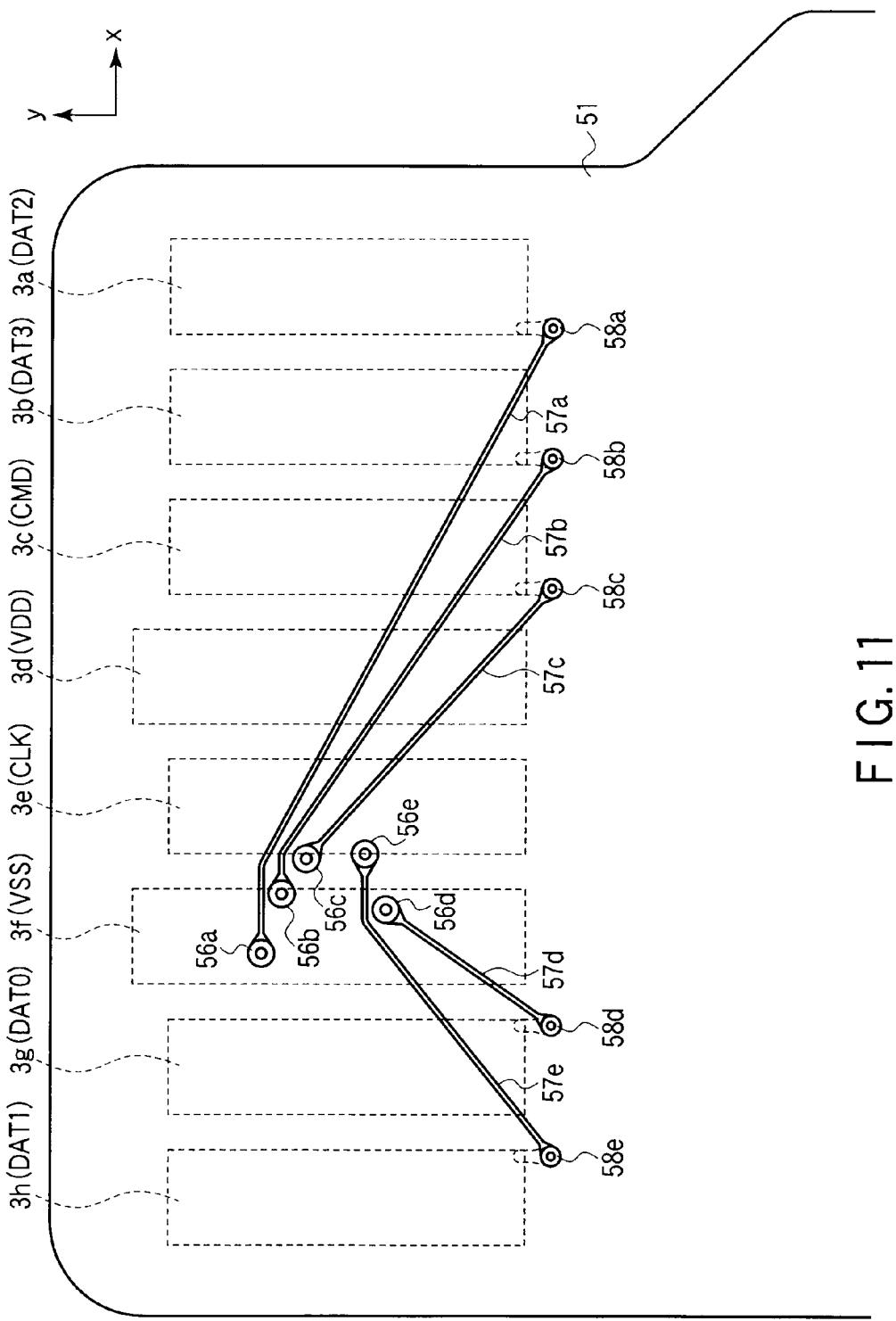
FIG. 11 illustrates one layer of the circuit board according to the second embodiment.

The second embodiment is different from the first embodiment only in the circuit board, and the same as the first embodiment except for a configuration of the circuit board. FIGS. 9, 10, 11 and 12 illustrate each layer of a circuit board 51 of a memory card 1 according to the second embodiment. FIGS. 9, 10, 11 and 12 also illustrate the configurations of the adjacent layers in dashed lines, respectively. FIGS. 9, 10 and 11 illustrate some of the elements provided in the circuit board 51 for data signals (the "0" data to "3" data 3) and command signal. Other elements are omitted.

Figures 13, 14:
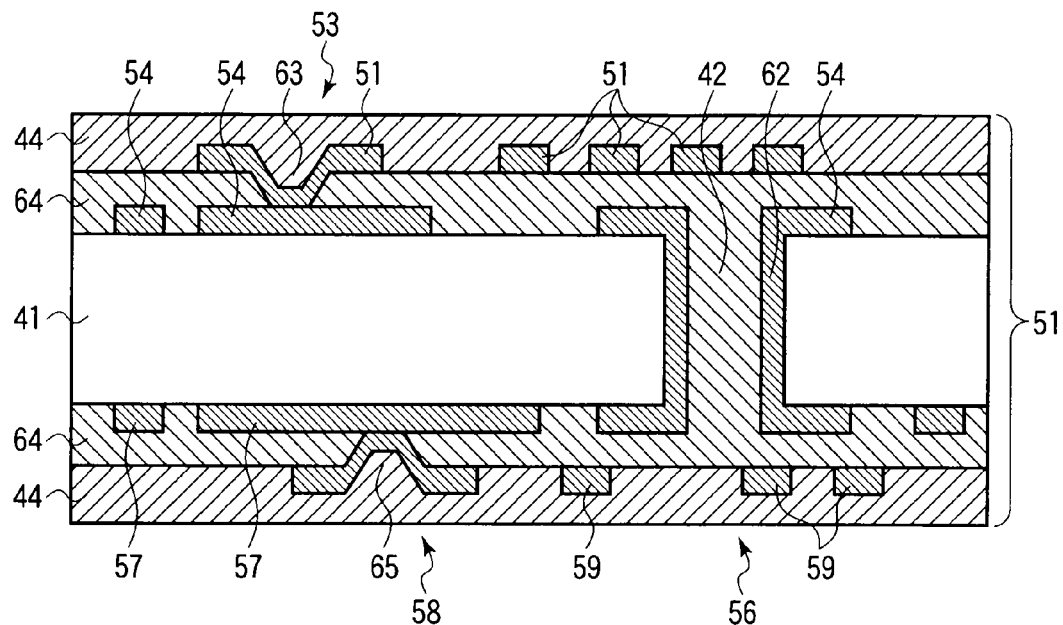
FIG. 13 is a sectional view of the circuit board according to the second embodiment.
FIG. 14 is a diagram showing lengths of signal paths according to the second embodiment.

The circuit board 51 has a multilayered configuration. The circuit board 51 has a sectional configuration as shown in FIG. 13 in order to realize the multilayered configuration. FIG. 13 shows a sectional view of the circuit board 51 according to the second embodiment. As shown in FIG. 13, the circuit board 51 includes a base member 41. Wirings 54 and 57 are provided on two main surfaces of the base member 41, respectively. The wirings 54 and 57 are made of copper foil and copper plating, for example, and have a specific plane shape described later. A conductive material 62 is provided on the side face of a through-hole 42, which is connected to the wrings 54 and 57 via the conductive material 62. The conductive material 62 is made of the same material as the wirings 54 and 57, for example. A plug 56 is formed by the through-hole 42 and the conductive material 62. The two main surfaces of the base member 41 and the wirings 54 and 57 are covered with prepreg 64. The prepreg 64 is embedded in the through-hole 42 via the conductive material 62.

Wirings 52 are provided on the prepreg 64 at the component side. The wirings 52 are made of copper foil and copper plating, for example, and have a specific plane shape described later. The prepreg 64 includes an opening 63 leading to the wiring 54 from the top surface at a portion. The wirings 52 are provided on the inner surface of the opening 63. The wirings 52 are connected to the wirings 54 inside the opening 63. A plug 53 is formed by the opening 63 and the wirings 52 inside the opening 63.

A board surface of the base member 41 has the same configuration. Wirings 59 are provided on the prepreg 64 on the terminal side. The wirings 59 are made of copper foil and copper plating, for example, and have a specific plane shape described later. The prepreg 64 includes an opening 65 leading to the wiring 57 from the lower surface at a portion. The wirings 59 are provided on the inner face of the opening 65. The wirings 59 are connected to the wirings 57 inside the opening 65. A plug 58 is formed by the opening 65 and the wirings 59 inside the opening.

FIGS. 9, 10, 11 and 12 are referred to again. FIG. 9 shows the component side of the circuit board 51. FIG. 9 shows also a layer (first inner layer) below the component side in dashed lines. As shown in FIG. 9, the circuit board 51 has substantially the same plane shape as the circuit board 11. The circuit board 51 includes an array of connection pads 15 and an array of resistor devices 22 having the same orientations as those of the circuit board 11 at the same positions.

The wirings 52a to 52e spread in fan-like manner with the connection pads 15 as the starting point, and are connected to the resistor devices 22a to 22e, respectively. The wirings 52a to 52d are connected to the lower ends of the resistor devices 22a to 22d, respectively. The wiring 52e is connected near the lower left end of the resistor device 22e.

The plugs 53a to 53d are formed above the resistor devices 22a to 22d, respectively. The plug 53e is formed near the right end of and below the resistor device 22e. The other ends of the resistor devices 22a to 22e are connected to the plugs 53a to 53e via the wirings 52a to 52e, respectively.

The circuit board 51 includes a plurality of lines 52f. Each line 52f is connected to one of the wirings 52a to 52e or the plug 53e. The wirings 52f extend substantially along the y-axis, and reaches near the upper end of the circuit board 51, more specifically, slightly above the upper end of the external connection terminal 3d like the lines 31f of the first embodiment.

FIG. 10 shows the first inner layer of the circuit board 51, and also shows a configuration of a layer (second inner layer) below the first inner layer in dashed lines. As shown in FIG. 10, plugs 56a and 56b are formed at the lower right of the plugs 53a and 53b, respectively. A plug 56c is formed below the plug 53c. The plugs 56a to 56c have different y-axis coordinates. A plug 56e is formed further below the plug 56c and to the left of the plug 53e. A plug 56d is formed at the lower left of the plug 56e.

The plugs 53a to 53e are connected to the plugs 56a to 56e via the wirings 54a to 54e, respectively. The wirings 54a, 54b, 54c and 54e run along the shortest paths connecting the plug 53a and the plug 56a, the plug 53b and the plug 56b, the plug 53d and the plug 56d, and the plug 53e and the plug 56e, respectively. The wiring 54d passes between the plugs 56c and 56e.

FIG. 11 shows the second inner layer of the circuit board 51, and also shows a configuration of the terminal side in dashed lines. As shown in FIG. 11, plugs 58a, 58b and 58c are formed below the left ends of the external connection terminals 3a, 3b and 3c, respectively. Plugs 58d and 58e are formed below the right ends of the external connection terminals 3d and 3e, respectively. The plugs 56a to 56e are connected to the plugs 58a to 58e via the wirings 57a to 57e, respectively. The wiring 57c runs along the shortest path connecting the plugs 56c and 58c. The wirings 57a and 57b extend along the x-axis so as not to contact the plugs 56 and other wirings 57, and then extend toward the lower right. The wiring 57e runs along the shortest path connecting the plugs 56e and 58e. The wiring 57d extends along the x-axis so as not to contact the plugs 56 and the other wirings 57, and then extends toward the lower left.

Figure 12:
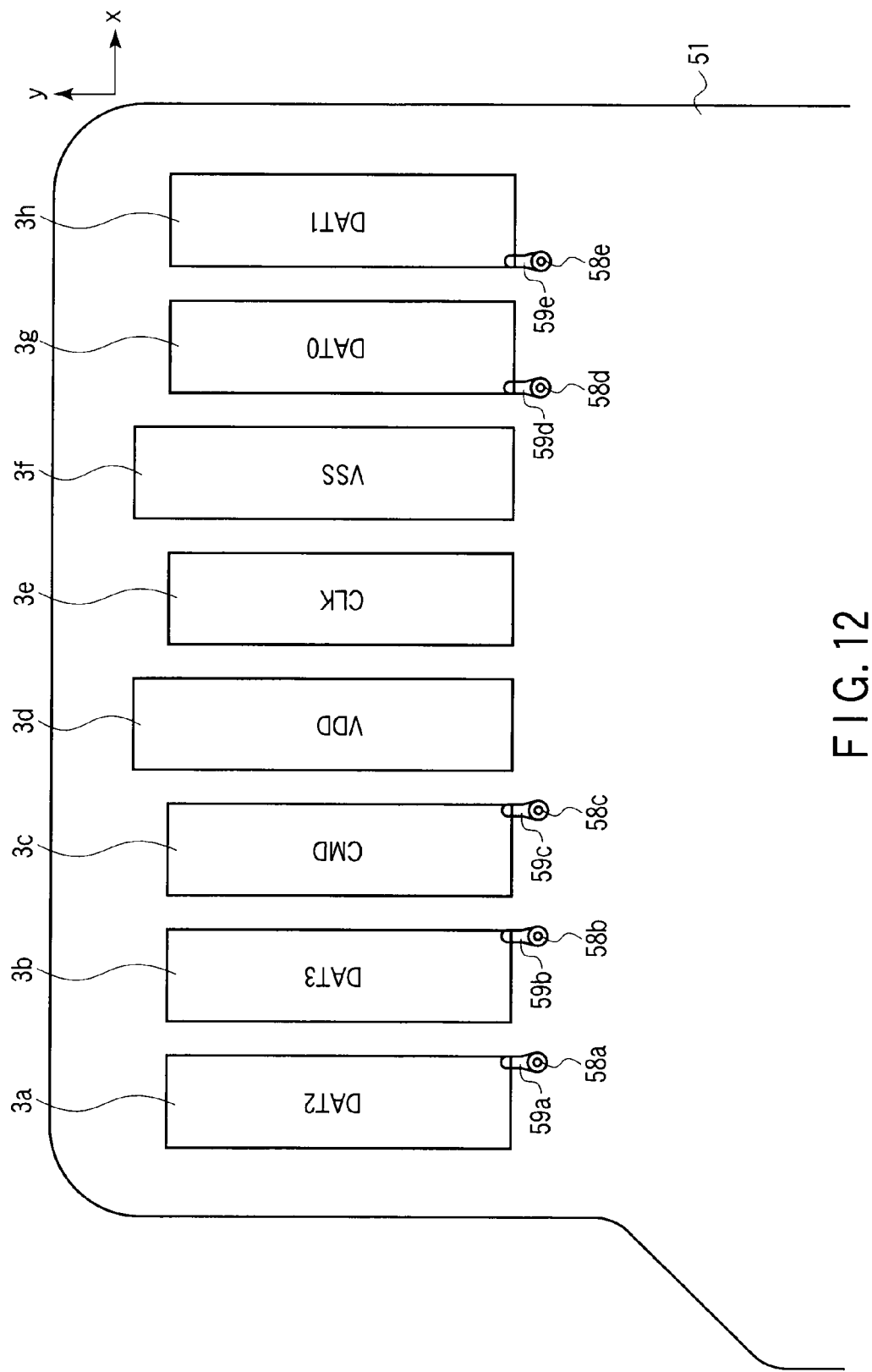
FIG. 12 illustrates one layer of the circuit board according to the second embodiment.

FIG. 12 shows the terminal side of the circuit board 51. As shown in FIG. 12, the plugs 58a to 58e are connected to the external connection terminals 3a, 3b, 3c, 3g and 3h via the wirings 59a to 59e, respectively. The wirings 59a to 59e extend along the y-axis.

The circuit board 51 has a four-layered configuration, and the connection pads 15, the wirings 52, 54, 57, 59, the resistor devices 22, and the plugs 53, 56, 58 are formed and arranged as described above. Thus, when the memory card 1 is a micro SD card, the signal path lengths shown in FIG. 14 are enabled. In other words, the signal path lengths between the external connection pads 13 in the controller chip 21 and the resistor devices 22 are 1.14 mm, 1.48 mm, 0.82 mm, 0.76 mm and 0.94 mm for data DATA0, DATA1, DATA2, DATA3 and command CMD, respectively, as in the first embodiment.

Every value is less than 1.5 mm. The signal path lengths between the external connection pads 13 in the controller chip 21 and the external connection terminals 3 are 5.22 mm, 6.91 mm, 7.75 mm, 6.27 mm and 5.27 mm for data DATA0, DATA1, DATA2, DATA3 and command CMD, respectively. Every value is less than 8 mm.

As described above, the memory card according to the second embodiment includes the array of the connection pads 15 along the array of the external connection pads 13, the resistor devices 22 positioned above the array of the connection pads 15 in the xy plane, and the four-layered circuit board 51. With this arrangement, the same advantages as those of the first embodiment can be obtained. The four-layered circuit board 51 is used to overcome the constraint that inhibits plugs to be positioned to overlap with the external connection terminals 3, and allows the controller chip 21 to be provided on the component side of the circuit board 11. Since the plugs 58 do not overlap on the external connection terminals 3, reliability can remain high for the mechanical configuration at the boundaries between the plugs 58 and the external connection terminals 3 and therearound. Since the controller chip 21 can be arranged on the component side, the controller chip 21 designed to be suitable for being arranged on the terminal side of the circuit board is allowed to be positioned on the component side of the circuit board 51, thereby promoting the manufacture of the memory card 1 through the controller chip 21.

According to the second embodiment, the four-layered circuit board 51 is used. Thus, the wirings do not need to bypass other elements unlike the first embodiment. Consequently, the signal path lengths can be shorter than those in the first embodiment. A reduction in signal path length can realize reduction in additional capacity and inductance of the signal path, thereby reducing the risk of erroneous operations of the memory card 1 as compared with the first embodiment.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor storage device comprising:
a memory chip comprising a memory circuit;
a controller chip comprising a control circuit to control the memory circuit;
a circuit board comprising opposite first and second surfaces and an array of external connection terminals on the first surface, the memory chip and the controller chip being provided on the second surface;
an array of connection pads provided on the second surface of the circuit board and outside the memory chip at an external connection terminal side, and connected to the controller chip;
an array of resistor devices provided on the second surface and provided along the array of connection pads at the opposite side of the memory chip, the resistors being connected at respective one ends to the connection pads;
conductive plugs provided outside near-memory-chip ends of the external connection terminals, and penetrating the first surface and the second surface;
a first wiring provided on the second surface, connected at one end to the other end of one resistor device, passing outside the array of resistor devices and outside the array of connection pads, and connected at the other end to one plug at the second surface; and
a second wiring provided on the first surface, and connecting one plug and one external connection terminal.

2. The device according to claim 1, wherein the controller chip has a rectangular shape, includes an array of external connection pads along only a top end and a left end, and is arranged at an upper left corner of the memory chip,
paths of a data signal and a command signal includes the external connection pads along the top end, and
the first and second wirings are the paths of the data signal and the command signal.

3. The device according to claim 1, wherein the array of connection pads is provided on the back of the array of external connection terminals, and
the array of resistor devices is provided on the back of and near the center of the array of external connection terminals.

4. The device according to claim 1, further comprising a third wiring provided on the second surface, connected at one end to one plug, extending along lower end of the array of external connection terminals in the opposite direction to the array of connection pads, and reaching an end of the array of external connection terminals.

5. The device according to claim 1, wherein the second wiring extends along the outermost external connection terminal on the back of the outermost external connection terminal, extends along a top side of an outermost external connection terminal and reaches near a top end of the circuit board.

6. The device according to claim 1, further comprising a sealing member which seals the memory chip, the controller chip, the circuit board, the array of connection pads, the array of resistor devices, the plugs, the first wiring and the second wiring while exposing at least part of the external connection terminals.

7. The device according to claim 6, wherein the device is a memory card.

8. The device according to claim 7, wherein the device is a micro SD card.

9. The device according to claim 1, wherein each length of signal paths for the data signal and the command signal between the controller chip and respective resistor devices is 4 mm or less, and
each length of signal paths for the data signal and the command signal between the controller chip and the respective external connection terminals is 10 mm or less.

10. The device according to claim 1, further comprising a third wiring extending along lower end of the array of external connection terminals in the opposite direction to the array of connection pads, a right end of the array of external connection terminals, and reaches slightly above the upper end of the external connection terminal.

11. The device according to claim 1, wherein the array of connection pads is provided between the memory chip and the array of resistor devices.

12. A semiconductor storage device comprising:
a memory chip comprising a memory circuit;
a controller chip comprising a control circuit to control the memory circuit;
a circuit board comprising opposite first and second surfaces and an array of external connection terminals on the first surface, the memory chip and the controller chip being provided on the second surface;

an array of connection pads provided on the second surface of the circuit board and outside the memory chip at an external connection terminal side, and connected to the controller chip;

an array of resistor devices provided on the second surface and provided along the array of connection pads at the opposite side of the memory chip, the resistors being connected at respective one ends to the connection pads;

wirings provided on the first surface and the second surface and inside the circuit board, and connecting the other ends of the resistor devices and the external connection terminals; and conductive plugs connecting wiring on the first surface of the circuit board, wiring on the second surface of the circuit board, and wiring inside the circuit board.

13. The device according to claim 12, wherein the controller chip has a rectangular shape, comprises an array of external connection pads along only a top end and a left end, and is arranged at an upper left corner of the memory chip, paths of a data signal and a command signal includes the external connection pads along the top end, and the first and second wirings are the paths of the data signal and the command signal.

14. The device according to claim 12, wherein the array of connection pads is provided on the back of the array of external connection terminals, and the array of resistor devices is provided on the back of and near the center of the array of external connection terminals.

15. The device according to claim 12, wherein the circuit board further comprises at least one inner layer provided on the first and second surfaces, inner wiring provided in the inner layer and outer wiring on the inner layer, and plugs connecting the inner wiring and the outer wiring, and the wiring on the first surface of the circuit board and the wiring on the second surface of the circuit board are connected via the conductive plugs and via the inner wirings and the plugs.

16. The device according to claim 12, further comprising a sealing member which seals the memory chip, the controller chip, the circuit board, the array of connection pads, the array of resistor devices, the plugs, the first wiring and the second wiring while exposing at least part of the external connection terminals.

17. The device according to claim 16, wherein the device is a memory card.

18. The device according to claim 17, wherein the device is a micro SD card.

19. The device according to claim 12, wherein each length of signal paths for the data signal and the command signal between the controller chip and respective resistor devices is 4 mm or less, and each length of signal paths for the data signal and the command signal between the controller chip and the respective external connection terminals is 10 mm or less.

* * * * *